United States Patent
Xue et al.

(10) Patent No.: US 11,258,016 B2
(45) Date of Patent: Feb. 22, 2022

(54) DISPLAY BACKPLANE, METHOD FOR PREPARING THE SAME, AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Zhiyong Xue, Beijing (CN); Nini Bai, Beijing (CN); Liman Peng, Beijing (CN); Liangliang Liu, Beijing (CN); Qianqian Zhang, Beijing (CN); Shujie Liu, Beijing (CN); Hailong Li, Beijing (CN); Lingling Ma, Beijing (CN); Hongyu Mi, Beijing (CN); Xu Liu, Beijing (CN); Qiang Chen, Beijing (CN); Guodong Jing, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 49 days.

(21) Appl. No.: 16/959,379

(22) PCT Filed: Dec. 20, 2019

(86) PCT No.: PCT/CN2019/126939
§ 371 (c)(1),
(2) Date: Jun. 30, 2020

(87) PCT Pub. No.: WO2020/140769
PCT Pub. Date: Jul. 9, 2020

(65) Prior Publication Data
US 2021/0074920 A1 Mar. 11, 2021

(30) Foreign Application Priority Data

Jan. 4, 2019 (CN) .......................... 201910007859.8

(51) Int. Cl.
*H01L 27/15* (2006.01)
*H01L 51/00* (2006.01)
(Continued)

(52) U.S. Cl.
CPC ...... *H01L 51/0012* (2013.01); *H01L 27/1218* (2013.01); *H01L 27/1296* (2013.01); *H01L 51/56* (2013.01)

(58) Field of Classification Search
USPC ........................................................ 257/522
See application file for complete search history.

(56) References Cited

U.S. PATENT DOCUMENTS 7,206,472 B2 * 4/2007 Huang ................. G02B 6/4206
385/129
9,287,329 B1 * 3/2016 Lee ..................... H01L 27/1218
(Continued)

FOREIGN PATENT DOCUMENTS

| CN | 104362079 A | 2/2015 |
| CN | 105378821 A | 3/2016 |

(Continued)

OTHER PUBLICATIONS

First Office Action for Chinese Application No. 201910007859.8, dated Mar. 4, 2020, 5 Pages.
(Continued)

*Primary Examiner* — Caleb E Henry
(74) *Attorney, Agent, or Firm* — Brooks Kushman P.C.

(57) ABSTRACT

The present disclosure provides a display backplane, a method for preparing the same, and a display device. The display backplane includes a substrate, an electronic device
(Continued)

and an alignment mark arranged on the substrate, and a filling layer, the filling layer being filled in at least a part of a recessed area located on a surface of the substrate away from the electronic device, and a minimum distance between an orthogonal projection of the at least part of the recessed area on the substrate and an orthogonal projection of the alignment mark on the substrate being less than 200 μm.

14 Claims, 3 Drawing Sheets

(51) Int. Cl.
*H01L 27/12* (2006.01)
*H01L 51/56* (2006.01)

(56) References Cited

U.S. PATENT DOCUMENTS

| | | | | |
|---|---|---|---|---|
| 2001/0006246 | A1* | 7/2001 | Kwag | H01L 21/7684 257/522 |
| 2006/0210213 | A1* | 9/2006 | Huang | G02B 6/4206 385/14 |
| 2010/0134727 | A1* | 6/2010 | Von Werne | G02F 1/167 349/106 |
| 2015/0076504 | A1* | 3/2015 | Im | H01L 29/78678 257/75 |
| 2016/0035812 | A1* | 2/2016 | Kwon | H01L 29/66757 257/40 |
| 2016/0093644 | A1* | 3/2016 | Ki | H01L 27/1244 257/40 |
| 2016/0093684 | A1 | 3/2016 | Youk et al. | |
| 2016/0165735 | A1 | 6/2016 | Akasaka et al. | |
| 2017/0256754 | A1* | 9/2017 | Defranco | H01L 51/5203 |
| 2018/0151804 | A1* | 5/2018 | Chaji | H01L 51/0031 |
| 2020/0251327 | A1* | 8/2020 | Guan | B23K 26/0648 |

FOREIGN PATENT DOCUMENTS

| | | |
|---|---|---|
| CN | 105785632 A | 7/2016 |
| CN | 106229295 A | 12/2016 |
| CN | 107068861 A | 8/2017 |
| CN | 108110020 A | 6/2018 |
| CN | 208240682 U | 12/2018 |
| CN | 109728165 A | 5/2019 |
| WO | 2005015655 A1 | 2/2005 |

OTHER PUBLICATIONS

International Search Report and Written Opinion for Application No. PCT/CN2019/126939, dated Mar. 20, 2020, 11 Pages.

* cited by examiner

DISPLAY BACKPLANE, METHOD FOR PREPARING THE SAME, AND DISPLAY DEVICE

CROSS-REFERENCE TO RELATED APPLICATIONS

This application is the U.S. national phase of PCT Application No. PCT/CN2019/126939 filed on Dec. 20, 2019, which claims priority to Chinese Patent Application No. 201910007859.8 filed on Jan. 4, 2019, which are incorporated herein by reference in their entireties.

TECHNICAL FIELD

The present disclosure relates to the field of display technology, in particular, to a display backplane, a method for preparing the same, and a display device.

BACKGROUND

In the preparation process of the organic light-emitting diode display device, when the surface of the substrate away from the electronic device and the alignment mark has a recessed area and the recessed area is located proximate to the alignment mark in the display backplane, it is easy to cause that the alignment mark in the display backplane cannot be recognized during the module process.

SUMMARY

In one aspect, the present disclosure provides a display backplane, including: a substrate, an electronic device and an alignment mark arranged on the substrate, and a filling layer, the filling layer being filled in at least a part of a recessed area located on a surface of the substrate away from the electronic device, and a minimum distance between an orthogonal projection of the at least part of the recessed area on the substrate and an orthogonal projection of the alignment mark on the substrate being less than 200 μm.

Optionally, the filling layer is filled in the whole recessed area located on the surface of the substrate away from the electronic device.

Optionally, the substrate includes a thinned substrate, and in a direction perpendicular to the substrate, a total thickness of the thinned substrate and the filling layer is less than the thickness of the substrate before thinning.

Optionally, a maximum thickness of the filling layer in the direction perpendicular to the substrate being greater than or equal to a depth of the recessed area in the direction perpendicular to the substrate.

Optionally, an optical performance of the filling layer is the same as an optical performance of the substrate.

In another aspect, based on the above technical solution of the display backplane, the present disclosure provides a display device including the above display backplane.

In a yet aspect, based on the above technical solution of the display backplane, the present disclosure provides a method for preparing the display backplane as above mentioned. The method includes: forming the electronic device and the alignment mark on the substrate; and forming the filling layer on the surface of the substrate away from the electronic device, the filling layer being filled in at least the part of the recessed area located on the surface of the substrate away from the electronic device, and the minimum distance between the orthogonal projection of the at least part of the recessed area on the substrate and the orthogonal projection of the alignment mark on the substrate being less than 200 μm.

Optionally, before the forming the filling layer, the method further includes: performing a thinning operation on the surface of the substrate away from the electronic device, and in the direction perpendicular to the substrate, the total thickness of the thinned substrate and the filling layer is less than the thickness of the substrate before thinning.

Optionally, the filling layer is filled in the whole recessed area located on the surface of the substrate away from the electronic device, the forming the filling layer on the surface of the substrate away from the electronic device specifically includes: coating an adhesive material on the surface of the substrate away from the electronic device, the adhesive material being filled in the whole recessed area, and the optical performance of the adhesive material being the same as the optical performance of the substrate; and curing the adhesive material to form the filling layer, a maximum thickness of the filling layer in the direction perpendicular to the substrate being greater than or equal to the depth of the recessed area in the direction perpendicular to the substrate.

Optionally, the filling layer is filled in at least the part of the recessed area located on the surface of the substrate away from the electronic device, before the curing the adhesive material, the method further includes: exposing the adhesive material to form an adhesive material reserved area and an adhesive material removal area, in which the adhesive material reserved area corresponds to a target area, an orthogonal projection of the target area on the substrate covering the orthogonal projection of the at least part of the recessed area on the substrate; and the adhesive material removal area corresponds to an area other than the target area; and removing the glue material located in the glue material removal area.

The curing the adhesive material specifically includes: curing the adhesive material located in the adhesive material reserved area.

BRIEF DESCRIPTION OF THE DRAWINGS

The drawings described herein are intended to provide a further understanding of the present disclosure, and constitute a part of the present disclosure. The illustrative embodiments of the present disclosure and the description thereof are intended to illustrate the present disclosure, and do not constitute an improper limitation of the present disclosure. In the drawings.

DETAILED DESCRIPTION

In order to further illustrate the display backplane and the method for preparing the same and the display device provided by the embodiments of the present disclosure, the present disclosure will be described in detail hereinafter in conjunction with the drawings.

Figure 1:
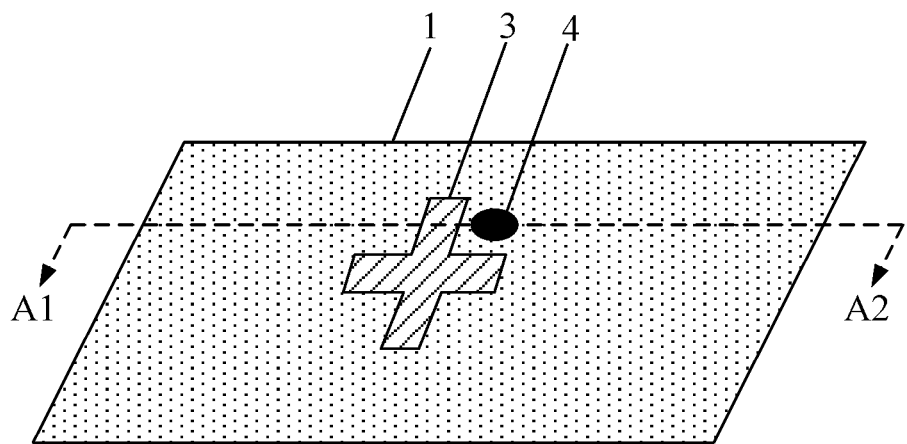
FIG. 1 is a schematic view showing the recessed area proximate to the alignment mark in the related art.
Figure 2:
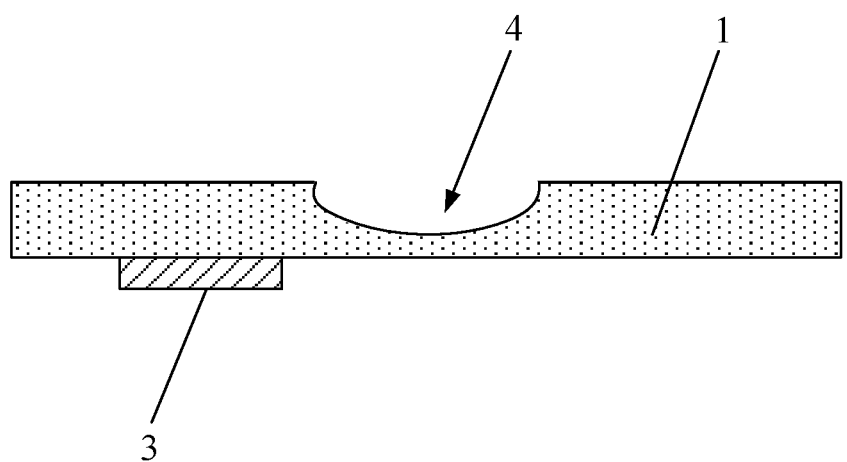
FIG. 2 is a schematic view showing the cross section taken along the direction A1-A2 in FIG. 1.

The process for preparing the organic light-emitting diode display device generally includes: as shown in FIGS. 1 and 2, the display backplane is prepared first, the display backplane including a substrate 1, and an electronic device and an alignment mark 3 formed on the substrate 1, then a light-emitting unit continues to be formed on a surface of the substrate on which the electronic device and the alignment mark 3 are formed, the module process is performed, the position of the alignment mark 3 is observed and recognized from the surface of the substrate 1 away from the electronic device and the alignment mark 3 using a microscope, and a module such as a flexible circuit board is bound to the display backplane.

However, when the surface of the substrate 1 away from the electronic device and the alignment mark 3 has a recessed area 4 and the recessed area 4 is located proximate to the alignment mark in the display backplane, it is easy to cause that the alignment mark 3 in the display backplane cannot be recognized during the module process.

An object of the present disclosure is to provide a display backplane, a method for preparing the same, and a display device, which are used to solve the problem that the recessed area existing on the substrate in the display backplane in the related art easily affects the identification of the alignment mark.

Figure 4:
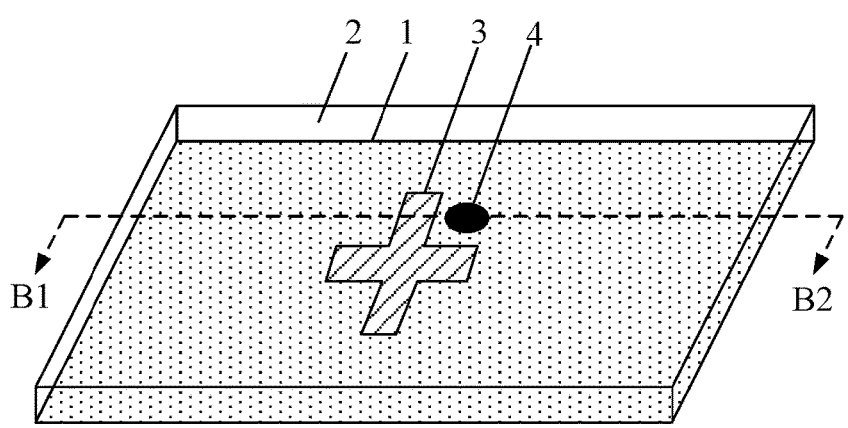
FIG. 4 is a schematic view showing the forming the filling layer in the recessed area according to an embodiment of the present disclosure.
Figure 5:
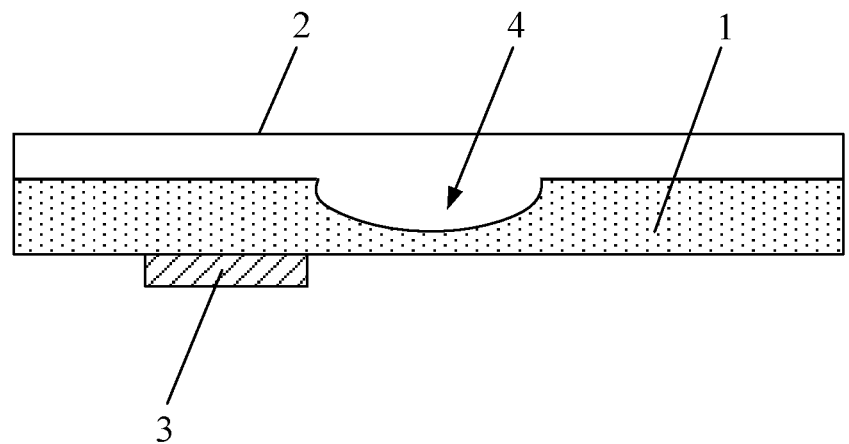
FIG. 5 is a schematic view showing the cross section taken along the direction B1-B2 in FIG. 4.
Figure 6:
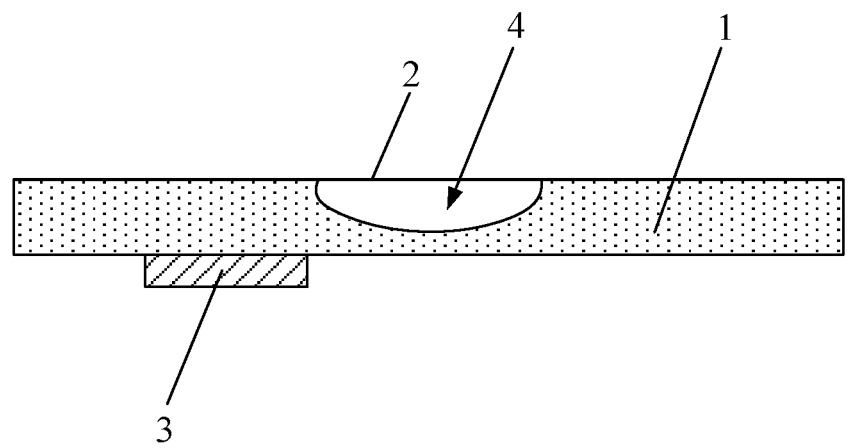
FIG. 6 is a schematic view showing the filling layer just filling the recessed area.

As shown in FIGS. 4 to 6, an embodiment of the present disclosure provides a display backplane, including a substrate 1, an electronic device and an alignment mark 3 arranged on the substrate 1, and a filling layer 2, the filling layer 2 being filled in at least a part of the recessed area 4 on the surface of the substrate 1 away from the electronic device, and a minimum distance between an orthogonal projection of the at least the part of the recessed area 4 on the substrate 1 and an orthogonal projection of the alignment mark 3 on the substrate 1 being less than 200 µm.

Specifically, the electronic device and the alignment mark 3 can be formed on the same surface of the substrate 1 first, and then the filling layer 2 can be formed on the surface of the substrate 1 away from the electronic device, and the filling layer 2 being capable of filling the at least part of the recessed area 4 located on the surface of the substrate 1 away from the electronic device, and an orthogonal projection of the at least part of the recessed area 4 on the substrate 1 being located within a peripheral preset range centered on the orthogonal projection of the alignment mark 3 on the substrate 1. In more detail, the minimum distance between the orthogonal projection of the at least part of the recessed area 4 on the substrate 1 and the orthogonal projection of the alignment mark 3 on the substrate 1 is less than 200 µm, that is, the orthogonal projection of the at least part of the recessed area 4 on the substrate 1 may partially overlap the orthogonal projection of the alignment mark 3 on the substrate 1, or the orthogonal projection of the at least part of the recessed area 4 on the substrate 1 is located proximate to the orthogonal projection of the alignment mark 3 on the substrate 1. It should be noted that the above-mentioned peripheral preset range centered on the orthogonal projection of the alignment mark 3 on the substrate 1 can be set according to actual needs, as long as the peripheral preset range can include the whole recessed area 4 that affects the identification of the alignment mark 3. For example, the above-mentioned peripheral preset range centered on the orthogonal projection of the alignment mark 3 on the substrate 1 is limited to an edge area surrounding the display area in the display backplane, but it is not limited to this.

When the above display backplane is used to prepare a display device, in the module process, the surface of the substrate 1 away from the electronic device can be observed by a microscope to accurately identify the alignment mark 3, and then the module such as the flexible circuit board can be bound to the display backplane according to the alignment mark 3.

According to the specific structure and application mode of the display backplane described above, in the display backplane provided by the embodiment of the present disclosure, a filling layer 2 is formed on the surface of the substrate 1 away from the electronic device, in which the filling layer 2 is capable of filling at least a part of the recessed area 4 located on the surface of the electronic device, and a minimum distance between an orthogonal projection of the at least part of the recessed area 4 on the substrate 1 and the orthogonal projection of the alignment mark 3 on the substrate 1 is less than 200 µm, so that the at least part of the recessed area 4 located in the peripheral preset range of the alignment mark 3 is filled with the filling layer 2, thereby preventing from affecting the at least part of the recessed area 4 on the identification of the alignment mark 3. Therefore, when the module process is performed by applying the display backplane according to the embodiment of the present disclosure, it is possible to accurately identify the alignment mark 3 on the display backplane, so as to avoid the poor alignment in the module process. In addition, the process for preparing the filling layer 2 on the display backplane is simple and easy to implement. Therefore, the display backplane provided by the embodiment of the present disclosure has a strong feasibility for mass production.

Optionally, the filling layer 2 provided by the above embodiment may also be filled in the whole recessed area 4 located on the surface of the substrate 1 away from the electronic device.

Specifically, the setting of the filling layer 2 being filled in the whole recessed area 4 on the surface of the substrate 1 away from the electronic device can not only ensure the accurate identification of the alignment mark 3 on the display backplane, but also allow the display backplane to have better optical performance. In this way, when the display backplane is applied to a display device, it is more conducive to the display effect of the display device.

Figure 3:
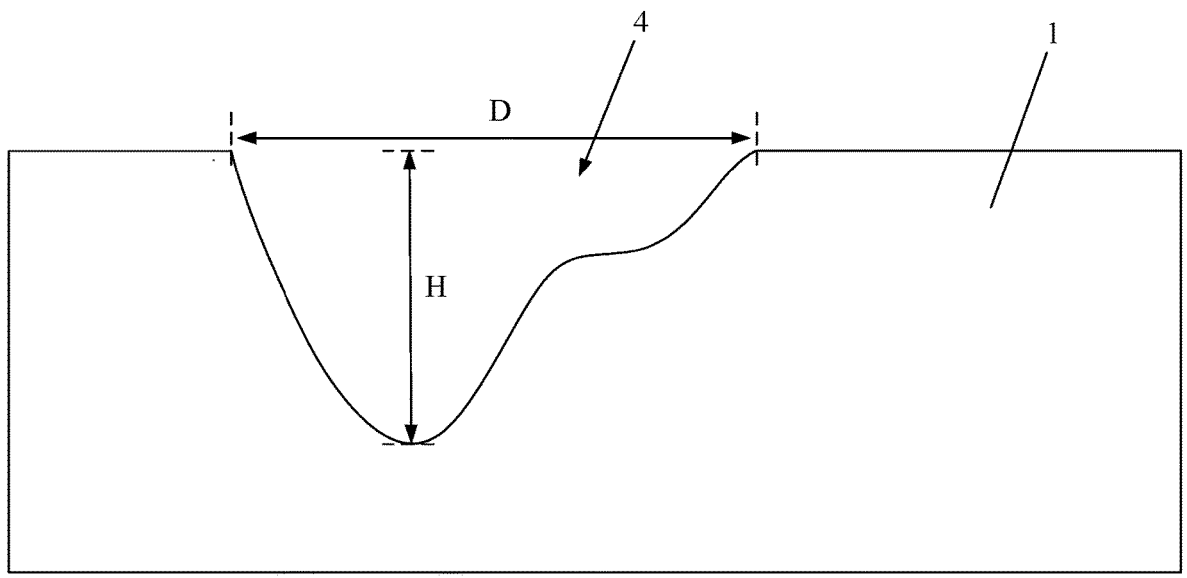
FIG. 3 is a schematic view showing the size of the recessed area.

Optionally, since the display device is becoming thinner and thinner, at present, in order to achieve the thinness of the display device, the substrate 1 of the display backplane in the display device is generally thinned, which is generally performed after the production of the display backplane is completed, that is, after the electronic device and the alignment mark 3 are prepared on the substrate 1, the surface of the substrate 1 away from the electronic device and the alignment mark 3 is chemically etched to reduce the thickness of the substrate 1. However, in this way, it is easy to produce a recessed area 4 on the thinned surface of the substrate 1, in which the diameter of the recessed area 4 is generally in a range from 20 µm to 110 µm. For example, as shown in FIG. 3, the depth H of the recessed area 4 is about 1.72 µm and the diameter D is about 107.57 µm.

When the substrate 1 provided in the above embodiment includes the thinned substrate 1, it can be arranged in a direction perpendicular to the substrate 1, and the total thickness of the thinned substrate 1 and the filling layer 2 is less than the thickness of the substrate 1 before thinning.

Specifically, in order to ensure that the thinned substrate 1 can make the display backplane thinner, the thickness of the filler layer 2 formed on the substrate 1 can be limited, so that the filler layer 2 is filled in the recessed area 4 located on the surface of the substrate 1 away from the electronic device and allows the total thickness of the thinned substrate 1 and the filling layer 2 to be less than the thickness of the substrate 1 before thinning in the direction perpendicular to the substrate 1 at the same time. Exemplarily, the thickness of the commonly used substrate is about 5 µm when it is not thinned; and after the substrate is thinned, the total thickness of the thinned substrate 1 and the filling layer 2 can be controlled in a range from 2.2 µm to 3 µm, but it is not limited to this.

Optionally, in the related art, when a thinning operation is performed on the substrate 1 in the display backplane, in order to avoid excessive thinning and causing a large number of recessed areas 4 on the surface of the substrate 1, the reduced thickness of the substrate 1 is generally limited. In the display backplane provided by the above embodiment, since the filling layer 2 is formed on the surface of the substrate 1 away from the electronic device and the filling layer 2 can be filled in the recessed area 4 located on the surface of the substrate 1 away from the electronic device, when the substrate 1 of the display backplane provided in the above embodiment is thinned, a relatively large thickness may be thinned to leave a margin for forming the filling layer 2, so that the total thickness of the thinned substrate 1 and the filling layer 2 can better meet the thinning requirement.

It is also worth noting that when the thickness of the display backplane is required, the thickness of the display backplane can be adjusted by controlling the thickness of the substrate 1 and the thickness of the filling layer 2.

In some embodiments, the maximum thickness of the filling layer 2 in the direction perpendicular to the substrate 1 may be set to be greater than or equal to the depth of the recessed area 4 in the direction perpendicular to the substrate 1.

Specifically, the thickness of the above-mentioned filling layer 2 can be set according to actual needs, so as to be completely filled in the recessed area 4. As shown in FIG. 6, when the maximum thickness of the filling layer 2 in the direction perpendicular to the substrate 1 is equal to the depth of the recessed area 4 in the direction perpendicular to the substrate 1, the filling layer 2 can be just filled in the recessed area 4, so that the filling layer 2 can repair the recessed area 4 and allows the display backplane to have a minimum thickness at the same time.

As shown in FIG. 5, when the maximum thickness of the filling layer 2 in the direction perpendicular to the substrate 1 is greater than the depth of the recessed area 4 in the direction perpendicular to the substrate 1, the filling layer 2 is equivalent to a planarization layer, that is, the filling layer 2 includes a portion filled in the recessed area 4 and a portion located outside the recessed area 4, and the surface of the filling layer 2 away from the electronic device is a flat surface. The filling layer 2 of this structure not only repairs the recessed area 4, but also makes the surface of the display backplane away from the electronic device more smooth, thereby ensuring that the display backplane has better optical performance.

In some embodiments, the optical performance of the filling layer 2 may be the same as or similar to the optical performance of the substrate 1.

Specifically, the setting of the optical performance of the filling layer 2 to be the same as or similar to the optical performance of the substrate 1 can allow that no refractive interface is formed between the filling layer 2 and the substrate 1, thereby preventing the filling layer 2 from adversely affecting the optical performance of the display backplane, so as to achieve a fundamental solution to solve the impact of the recessed area 4 on the display backplane and module process. There are various types of the filling layer 2 described above. For example, an adhesive material similar to the optical performance of the substrate 1 may be used. Optionally, when the substrate 1 in the display backplane is made of glass, acrylic may be used for preparing the filling layer 2.

An embodiment of the present disclosure further provides a display device including the display backplane provided by the above embodiment.

Since the display backplane provided by the above embodiment can accurately identify the alignment mark 3 on the display backplane when the module process is performed, the display device provided by the embodiment of the present disclosure, when including the above display backplane, can avoid the problem of poor alignment in the display device, thereby ensuring the production yield of the display device. In addition, since the display backplane provided by the above embodiment has a strong feasibility of mass production, the display device provided by the embodiment of the present disclosure, when including the above display backplane, can better adapt to the production line requirements of the display device.

An embodiment of the present disclosure further provides a method for preparing the display backplane provided by the above embodiments, and the method includes: forming an electronic device and an alignment mark 3 on a substrate 1; and forming a filling layer 2 on the surface of the substrate 1 away from the electronic device, the filling layer 2 being filled in at least a part of a recessed area 4 located on the surface of the substrate 1 away from the electronic device, and a minimum distance between an orthogonal projection of the at least part of the recessed area 4 on the substrate 1 and an orthogonal projection of the alignment mark 3 on the substrate 1 being less than 200 µm.

Specifically, the electronic device and the alignment mark 3 can be formed on the same surface of the substrate 1 first, and then the filling layer 2 can be formed on the surface of the substrate 1 away from the electronic device, and the filling layer 2 being capable of filling at least a part of the recessed area 4 located on the surface of the substrate 1 away from the electronic device. It should be noted that an orthogonal projection of the at least part of the recessed area 4 on the substrate 1 is located within a peripheral preset range centered on the orthogonal projection of the alignment mark 3 on the substrate 1, and the peripheral preset range can be set according to actual needs, as long as the peripheral preset range can include the whole recessed area 4 that affects the identification of the alignment mark 3. For example, the above-mentioned peripheral preset range centered on the orthogonal projection of the alignment mark 3 on the substrate 1 is limited to an edge area surrounding the display area in the display backplane, but it is not limited to this.

When the display backplane is prepared by the above method for preparing the display device, in the module process, the surface of the substrate 1 away from the electronic device in the display backplane can be observed by a microscope to accurately identify the alignment mark 3, and then the module such as the flexible circuit board can be bound to the display backplane according to the alignment mark 3.

In the method for preparing the display backplane provided by an embodiment of the present disclosure, the filling layer 2 is formed on the surface of the substrate 1 away from the electronic device, in which the filling layer 2 is capable of filling at least the part of the recessed area 4 located on the surface of the electronic device, and a minimum distance between the orthogonal projection of the at least part of the recessed area 4 on the substrate 1 and the orthogonal projection of the alignment mark 3 on the substrate 1 is less than 200 μm, so that the at least the part of the recessed area 4 located in the peripheral preset range of the alignment mark 3 is filled with the filling layer 2, thereby preventing from affecting the at least part of the recessed area 4 on the identification of the alignment mark 3. Therefore, when the module process is performed by applying the method for preparing the display backplane according to the embodiment of the present disclosure, it is possible to accurately identify the alignment mark 3 on the display backplane, so as to avoid the poor alignment in the module process. In addition, the process for preparing the filling layer 2 on the display backplane is simple and easy to implement. Therefore, the method provided by the embodiment of the present disclosure has a strong feasibility for mass production.

Optionally, before the filling layer 2 is formed, the method for preparing the display backplane provided by the above embodiment further includes: performing a thinning operation on the surface of the substrate 1 away from the electronic device.

Specifically, since the display device is becoming thinner and thinner, in order to achieve the thinning of the display device, the substrate 1 of the display backplane in the display device may be subjected to a thinning process, and the thinning process can be performed after the electronic device and the alignment mark 3 are prepared on the substrate 1. There are various specific thinning methods that can be used. For example, the thickness of the substrate 1 can be reduced by chemically etching the surface of the substrate 1 away from the electronic device and the alignment mark 3.

Optionally, when a thinning operation is performed on the surface of the substrate 1 away from the electronic device, it can be set in a direction perpendicular to the substrate 1, and the total thickness of the thinned substrate 1 and the filling layer 2 is less than the thickness of the substrate 1 before thinning. In more detail, in order to ensure that the thinned substrate 1 can make the display backplane thinner, the thickness of the filler layer 2 formed on the substrate 1 can be limited, so that the filler layer 2 is filled in the recessed area 4 located on the surface of the substrate 1 away from the electronic device and allows the total thickness of the thinned substrate 1 and the filling layer 2 to be less than the thickness of the substrate 1 before thinning in the direction perpendicular to the substrate 1 at the same time. Exemplarily, the thickness of the commonly used substrate is about 5 μm when it is not thinned; and after the substrate is thinned, the total thickness of the thinned substrate 1 and the filling layer 2 can be controlled in a range from 2.2 μm to 3 μm, but it is not limited to this.

Optionally, when a thinning operation is performed on the substrate 1 in the display backplane, in order to avoid excessive thinning and causing a large number of recessed areas 4 on the surface of the substrate 1, the reduced thickness of the substrate 1 is generally limited. In the display backplane prepared by the preparation method provided in the above embodiment, since the filling layer 2 is formed on the surface of the substrate 1 away from the electronic device and the filling layer 2 can be filled in the recessed area 4 on the surface of the substrate 1 away from the electronic device, when the substrate 1 of the display backplane is thinned, a relatively large thickness may be thinned to leave a margin for forming the filling layer 2, so that the total thickness of the thinned substrate 1 and the filling layer 2 can better meet the thinning requirement.

Optionally, during the filling layer 2 is filled in the whole recessed area 4 located on the surface of the substrate 1 away from the electronic device, the forming the filling layer 2 on the surface of the substrate 1 away from the electronic device specifically includes: coating an adhesive material on the surface of the substrate 1 away from the electronic device, the adhesive material being filled in the whole recessed areas 4, and an optical performance of the adhesive material being the same as an optical performance of the substrate 1; and curing the adhesive material to form the filling layer 2, a maximum thickness of the filling layer 2 in the direction perpendicular to the substrate 1 being greater than or equal to a depth of the recessed area 4 in the direction perpendicular to the substrate 1.

Specifically, a coating process may be used to apply an adhesive material on the surface of the substrate 1 away from the electronic device, in which the adhesive material can be filled in the whole recessed areas 4, and then the adhesive material is cured to form the filling layer 2.

Since the equipment used in the current coating process has high accuracy, when the filling layer 2 is formed by coating, the filling effect of the filling layer 2 on the recessed area 4 can be well guaranteed. More specifically, when the filling layer 2 is prepared by a glue developing machine, since the accuracy of the glue developing machine can be achieved to 0.9 μm, as for a recessed area 4 having a depth on the substrate 1 of 1.7 μm (currently, the depth of the recessed area 4 is generally around 1.7 μm), the prepared filling layer 2 can achieve a good filling.

It is worth noting that the optical properties of the adhesive material used can be the same as or similar to the optical properties of the substrate 1, so that it can allow that no refractive interface is formed between the filling layer 2 and the substrate 1, thereby preventing the filling layer 2 from adversely affecting the optical performance of the display backplane, so as to achieve a fundamental solution to solve the impact of the recessed area 4 on the display backplane and module process. In some embodiments, when the substrate 1 in the display backplane is made of glass, acrylic may be used for preparing the filling layer 2.

In addition, the thickness of the above-mentioned filling layer 2 can be set according to actual needs, so as to be completely filled the recessed area 4. As shown in FIG. 6, when the maximum thickness of the filling layer 2 in the direction perpendicular to the substrate 1 is equal to the depth of the recessed area 4 in the direction perpendicular to the substrate 1, the filling layer 2 can be just filled in the recessed area 4, so that the filling layer 2 can repair the recessed area 4 and allows the display backplane to have a minimum thickness at the same time. As shown in FIG. 5, when the maximum thickness of the filling layer 2 in the direction perpendicular to the substrate 1 is greater than the depth of the recessed area 4 in the direction perpendicular to the substrate 1, the filling layer 2 is equivalent to a planarization layer, that is, the filling layer 2 includes a portion filled in the recessed area 4 and a portion located outside the recessed area 4, and the surface of the filling layer 2 away from the electronic device is a flat surface. The filling layer 2 of this structure not only repairs the recessed area 4, but also makes the surface of the display backplane away from the electronic device more smooth, thereby ensuring that the display backplane has better optical performance.

Optionally, when the filling layer 2 is filled in at least a part of the recessed area 4 on the surface of the substrate 1 away from the electronic device, before the curing the adhesive material, the method for preparing the display backplane provided in the above embodiment further includes: exposing the adhesive material to form an adhesive material reserved area and an adhesive material removal area, in which the adhesive material reserved area corresponds to a target area, an orthogonal projection of the target area on the substrate 1 covering the orthogonal projection of the at least part of the recessed area 4 on the substrate 1, and the adhesive material removal area corresponds to an area other than the target area; and removing the glue material located in the glue material removal area.

The curing the adhesive material specifically includes: curing the adhesive material located in the adhesive material reserved area.

Specifically, when the filling layer 2 is filled in at least a part of the recessed area 4 on the surface of the substrate 1 away from the electronic device, before the curing the adhesive material, an exposure operation may be performed on the adhesive material to form an adhesive material reserved area and an adhesive material removal area, in which the adhesive reserved area corresponds to the target area, and the orthogonal projection of the target area on the substrate 1 covers the orthogonal projection of the at least part of the recessed area 4 on the substrate 1; and the adhesive removal area corresponds to an area other than the target area; then the adhesive material in the adhesive material removal area is removed, and the adhesive material in the adhesive material reserved area is reserved, so that the remaining adhesive material can be well filled in the at least part of the recessed area 4. Before the removing the adhesive material in the adhesive material removal area, the adhesive material in the adhesive material reserved area can be cured, so as to complete the preparation of the filling layer 2 that be only filled in the at least part of the recessed area 4.

The above method of manufacturing the filling layer 2 only filling the at least part of the recessed area 4 not only ensures that when the display backplane manufactured by using the manufacturing method provided in the above embodiment is applied to the module process, the pair of display backplanes can be accurately identified alignment mark 3, in order to avoid bad alignment in the module process, it also minimizes the amount of glue used, and reduces the production cost of the display backplane.

Unless otherwise defined, technical terms or scientific terms used herein have the normal meaning commonly understood by one skilled in the art in the field of the present disclosure. The words "first", "second", and the like used herein do not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like is not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

In the description of the above embodiments, the specific features, structures, materials or features may be combined in any suitable manner in any one or more embodiments or examples.

The above description is merely the specific embodiment of the present disclosure, but the scope of the present disclosure is not limited thereto. Moreover, any person skilled in the art would readily conceive of modifications or substitutions within the technical scope of the present disclosure, and these modifications or substitutions shall also fall within the protection scope of the present disclosure. Therefore, the protection scope of the present disclosure should be determined by the scope of the claims.

What is claimed is:

1. A display backplane comprising:
   a substrate,
   an electronic device and an alignment mark arranged on the substrate, and
   a filling layer, the filling layer being filled in at least a part of a recessed area located on a surface of the substrate away from the electronic device, and a minimum distance between an orthogonal projection of the at least part of the recessed area on the substrate and an orthogonal projection of the alignment mark on the substrate being less than 200 µm.

2. The display backplane of claim 1, wherein the filling layer is filled in the whole recessed area located on the surface of the substrate away from the electronic device.

3. The display backplane of claim 1, wherein the substrate comprises a thinned substrate, and in a direction perpendicular to the substrate, a total thickness of the thinned substrate and the filling layer is less than the thickness of the substrate before thinning.

4. The display backplane of claim 1, wherein a maximum thickness of the filling layer in the direction perpendicular to the substrate is greater than a depth of the recessed area in the direction perpendicular to the substrate.

5. The display backplane of claim 1, wherein an optical performance of the filling layer is the same as an optical performance of the substrate.

6. A display device comprising the display backplane of claim 1.

7. A method for preparing a display backplane comprising:
   forming an electronic device and an alignment mark on a substrate; and
   forming a filling layer on a surface of the substrate away from the electronic device, the filling layer being filled in at least a part of a recessed area located on the surface of the substrate away from the electronic device, and a minimum distance between an orthogonal projection of the at least part of the recessed area on the substrate and an orthogonal projection of the alignment mark on the substrate being less than 200 µm.

8. The method of claim 7, wherein before the forming the filling layer, the method further comprises:
   performing a thinning operation on the surface of the substrate away from the electronic device, and in a direction perpendicular to the substrate, a total thickness of the thinned substrate and the filling layer is less than a thickness of the substrate before thinning.

9. The method of claim 7, wherein the filling layer is filled in the whole recessed area located on the surface of the substrate away from the electronic device, the forming the filling layer on the surface of the substrate away from the electronic device comprises:

coating an adhesive material on the surface of the substrate away from the electronic device, the adhesive material being filled in the whole recessed area, and an optical performance of the adhesive material being the same as an optical performance of the substrate; and curing the adhesive material to form the filling layer, a maximum thickness of the filling layer in the direction perpendicular to the substrate being greater than or equal to a depth of the recessed area in the direction perpendicular to the substrate.

10. The method of claim 7, wherein the filling layer is filled in the part of the recessed area located on the surface of the substrate away from the electronic device, the forming the filling layer on the surface of the substrate away from the electronic device comprises:

coating an adhesive material on the surface of the substrate away from the electronic device, the adhesive material being filled in the part of the recessed area, and an optical performance of the adhesive material being the same as an optical performance of the substrate; and curing the adhesive material to form the filling layer, a maximum thickness of the filling layer in the direction perpendicular to the substrate being greater than or equal to a depth of the recessed area in the direction perpendicular to the substrate.

11. The method of claim 10, wherein before the curing the adhesive material, the method further comprises:

exposing the adhesive material to form an adhesive material reserved area and an adhesive material removal area, wherein an orthogonal projection of the adhesive material reserved area on the substrate overlaps with an orthogonal projection of a target area on the substrate, the orthogonal projection of the target area on the substrate covering the orthogonal projection of the part of the recessed area on the substrate; and an orthogonal projection of the adhesive material removal area on the substrate overlaps with an orthogonal projection of an area other than the target area on the substrate; and removing the adhesive material located in the adhesive material removal area; and the curing the adhesive material comprises:

curing the adhesive material located in the adhesive material reserved area.

12. The display backplane of claim 1, wherein the orthogonal projection of the at least part of the recessed area on the substrate partially overlaps with the orthogonal projection of the alignment mark on the substrate.

13. The display backplane of claim 1, wherein the orthogonal projection of the at least part of the recessed area on the substrate is located proximate to the orthogonal projection of the alignment mark on the substrate.

14. The display backplane of claim 1, wherein a maximum thickness of the filling layer in the direction perpendicular to the substrate is equal to a depth of the recessed area in the direction perpendicular to the substrate.

* * * * *